(12) United States Patent
Cruz-Albrecht et al.

(10) Patent No.: US 8,566,265 B1
(45) Date of Patent: Oct. 22, 2013

(54) COMBINED SPIKE DOMAIN AND PULSE DOMAIN SIGNAL PROCESSING

(75) Inventors: Jose Cruz-Albrecht, Oak Park (ES); Peter Petre, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 351 days.

(21) Appl. No.: 13/044,922

(22) Filed: Mar. 10, 2011

(51) Int. Cl.
- *G06E 3/00* (2006.01)
- *G06G 7/00* (2006.01)
- *G06N 3/04* (2006.01)
- *G06F 15/18* (2006.01)

(52) U.S. Cl.
USPC .................................. 706/27; 706/34; 706/35

(58) Field of Classification Search
None
See application file for complete search history.

(56) References Cited

U.S. PATENT DOCUMENTS

| | | | |
|---|---|---|---|
| 4,383,248 A | 5/1983 | Smith | |
| 4,939,515 A | 7/1990 | Adelson | |
| 5,185,715 A | 2/1993 | Zikan | |
| 5,345,398 A | 9/1994 | Lippmann et al. | 702/53 |
| 5,479,170 A | 12/1995 | Cauwenberghs et al. | 341/200 |
| 5,566,099 A | 10/1996 | Shimada | |
| 5,894,280 A | 4/1999 | Ginetti et al. | 341/118 |
| 6,172,536 B1 | 1/2001 | Yoshihara | |
| 6,452,524 B1 | 9/2002 | Fraleigh et al. | 341/143 |
| 6,473,019 B1 | 10/2002 | Ruha et al. | 341/143 |
| 6,975,682 B2 | 12/2005 | Cosand | 375/247 |
| 7,038,608 B1 | 5/2006 | Gilbert | 341/144 |
| 7,253,761 B1 | 8/2007 | Hoyos | |
| 7,324,035 B2 | 1/2008 | Harris | |
| 7,403,144 B1 | 7/2008 | Cruz-Albrecht | 341/143 |
| 7,405,686 B2 | 7/2008 | Laroia et al. | 341/143 |
| 7,515,084 B1 | 4/2009 | Cruz-Albrecht | |
| 7,573,956 B2 | 8/2009 | Lazar | |
| 7,592,939 B1 | 9/2009 | Cruz-Albrecht | |
| 7,724,168 B1 | 5/2010 | Cruz-Albrecht | |

(Continued)

OTHER PUBLICATIONS

U.S. Appl. No. 11/595,107, filed Nov. 10, 2006, Cruz-Albrecht.

(Continued)

*Primary Examiner* — Jeffrey A Gaffin
*Assistant Examiner* — Mikayla Chubb
(74) *Attorney, Agent, or Firm* — Ladas & Parry

(57) ABSTRACT

A neural network has an array of interconnected processors, at least a first processor in the array operating in a pulse domain and at least a second processor in the array operating in a spike domain, and each said processor having: first inputs selectively coupled to other processors in the array of interconnected processors, each first input having an associated VCCS (a 1 bit DAC) coupled to a summing node, second inputs selectively coupled to inputs of the neural network, the second inputs having current generators associated therewith coupled to said summing node, a filter/integrator for generating an analog signal corresponding to current arriving at the summing node, and for processors operating in the pulse domain, an analog-to-pulse converter for converting an analog signal derived either directly from the filter/integrator or via a non-linear element, to the pulse domain, and providing the converted analog signal as an unquantized pulse domain signal at an output of each processor operating in the pulse domain and for processors operating in the spike domain, an analog-to-spike converter for converting an analog signal derived either directly from the filter/integrator or via a non-linear element, to the spike domain, and providing the converted analog signal as an unquantized spike domain signal at an output of each processor operating in the spike domain; wherein the array of interconnected processors are selectively interconnected with unquantized pulse domain and spike domain signals.

20 Claims, 8 Drawing Sheets

(56) References Cited

U.S. PATENT DOCUMENTS

| | | | |
|---|---|---|---|
| 7,750,835 B1 | 7/2010 | Cruz-Albrecht | |
| 7,822,698 B1 * | 10/2010 | Cruz-Albrecht et al. | ....... 706/34 |
| 7,965,216 B1 | 6/2011 | Petre | |
| 7,996,452 B1 | 8/2011 | Cruz-Albrecht | |
| 2006/0087467 A1 | 4/2006 | Itskovich | |
| 2007/0069928 A1 | 3/2007 | Gehring | |

OTHER PUBLICATIONS

U.S. Appl. No. 11/726,860, filed Mar. 23, 2007, Cruz-Albrecht.
U.S. Appl. No. 12/118,475, filed May 9, 2008, Cruz-Albrecht.
U.S. Appl. No. 12/262,691, filed Oct. 31, 2008, Petre.
U.S. Appl. No. 12/262,782, filed Oct. 31, 2008, Cruz-Albrecht.
U.S. Appl. No. 12/266,299, filed Nov. 6, 2008, Cruz-Albrecht.
Author: Wikipedia; Title: Van der Pol oscillator; Date: Jun. 18, 2010; URL: http://en.wikipedia.org/wiki/Van_der_Pol_oscillator.
Author: Wikipedia; Title: "Relaxation oscillator"; Date: Jun. 18, 2010; URL: http://en.wikipedia.org/wiki/Relaxation_oscillator.
A. Lazar and L Toth, "Perfect Recovery and Sensitivity Analysis of Time Encoded Bandlimited Signals," IEEE Trans. on Circuits and Systems-I, vol. 51, No. 10, pp. 2060-2073, Oct. 2004.
J. Cruz et al., "A 16x16 Cellular Neural Network Universal Chip," in Cellular Neural Networks and Analog VLSI, edited by L. Chua et al., Kluwer Academic Publishers, 1998.
Dighe, A.M., et al., "An Asynchronous Serial Flash Converter", $9^{th}$ Int. Conf on Electronics, Circuits and Systems, IEEE, pp. 13-15, 2002.
D.Donoho, "Compressed Sensing", IEEE Transactions on Information Theory, vol. 42, No. 4, pp. 1289-1306, Apr. 2006.
Iwamoto, M. et al., "Bandpass Delta-Sigma Class-S Amplifier", Electronic Letters, vol. 36, No. 12, pp. 1010-1012, Jun. 2000.
J. Keane and L. Atlas, "Impulses and Stochastic Artihmetic for Signal Processing" Proc. 2001 IEEE International Conference on Acoustics, Speech, and Signal Processing, pp. 1257-1260.
U.S. Appl. No. 11/726,484, filed Mar. 22, 2007, Cruz-Albrecht, Jose et al.
U.S. Appl. No. 60/984,354, filed Oct. 31, 2007, Cruz-Albrecht, Jose.
U.S. Appl. No. 60/984,357, filed Oct. 31, 2007, Cruz-Albrecht, Jose.
Roza, E., Analog to Digital Conversion via Duty Cycle Modulation, IEEE Trans. on Circuits and Systems-II, vol. 44, No. 11, pp. 907-914, Nov. 1997.
Walden, R., "Analog to Digital Converter Survey and Analysis", IEEE Journal on Selected Areas in Communication, vol. 17, No. 4, pp. 539-550, Apr. 1999.
Y. Xia and J. Wang, "A Recurrent Neural Network for Solving Nonlinear Convex Programs Subject to Linear Constraints", IEEE Trans. on Neural Networks, vol. 16, No. 2, Mar. 2005.
Hasler, et al., "VLSI Neural Systems and Circuit" 1990 IEEE.
Wang, et al., "Review of pulse-coupled neural networks" 2009.
Laurent Perrinet, "Emergence of filters from natural scenes in a sparse spike coding scheme" 2004.

* cited by examiner

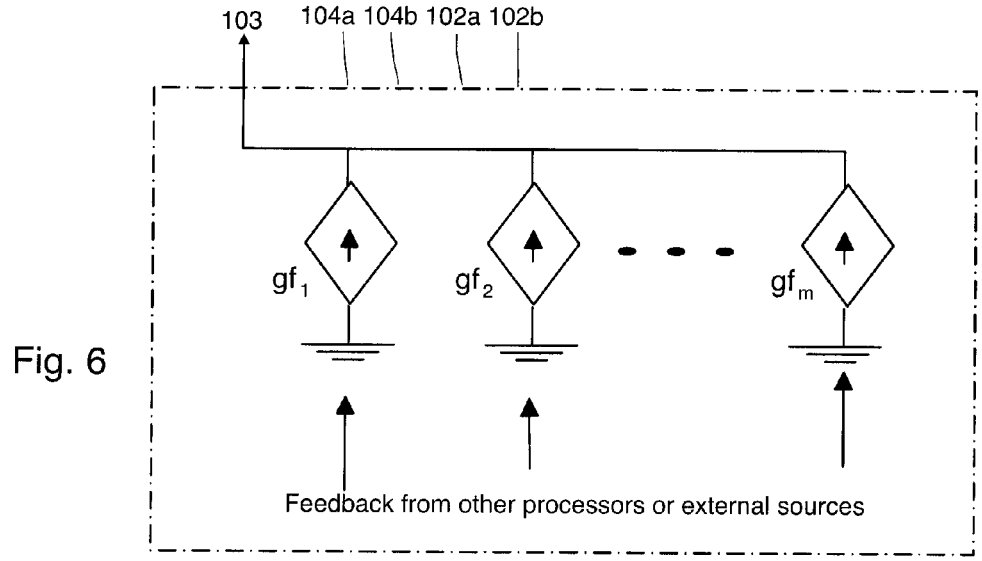
Array of voltage controlled current sources. Feedback from other cells are the inputs 35, 36, 37
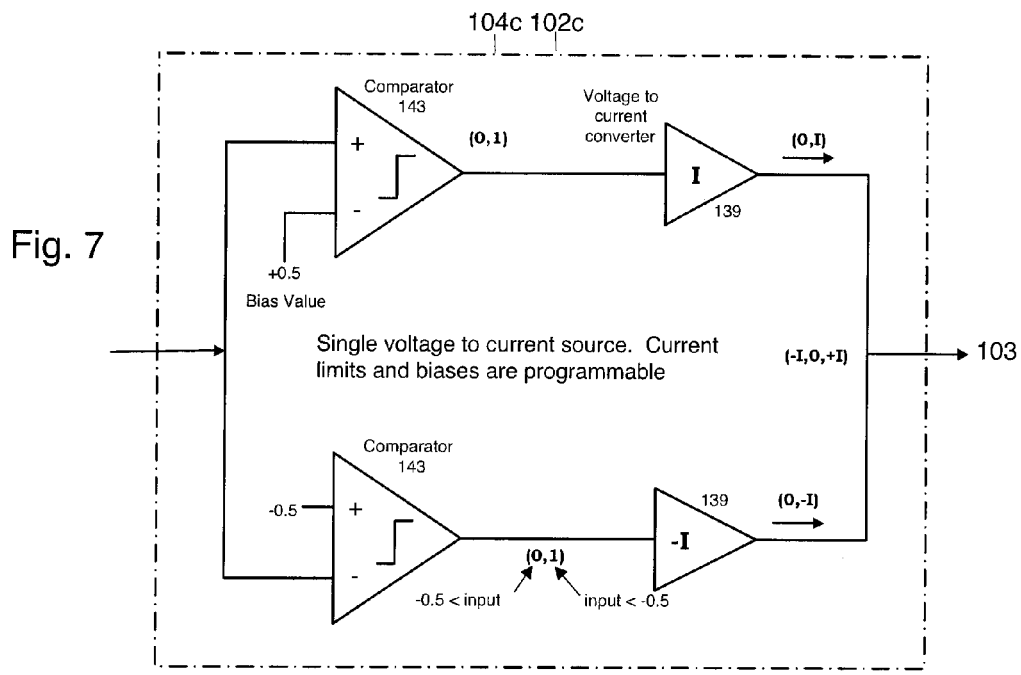

If the input is an analog external signal voltage, the output is a current proportional to the input voltage, ie scaled by another g.

Offsets in output shown for clarity and not to imply a limitation. Offset may be zero Edge to Bidirectional Spike Converter. Part of 110c

COMBINED SPIKE DOMAIN AND PULSE DOMAIN SIGNAL PROCESSING

CROSS-REFERENCE TO RELATED APPLICATIONS

This application is related to U.S. patent application Ser. No. 11/726,860, entitled "Spike Domain and Pulse Domain Non-Linear Processors", now U.S. Pat. No. 7,822,698, the disclosure of which is hereby incorporated herein by reference.

STATEMENT REGARDING FEDERALLY SPONSORED RESEARCH OR DEVELOPMENT

Not applicable.

TECHNICAL FIELD

This invention relates to a nonlinear network for signal processing. The network is composed of processing cells. The cells have analog dynamics. However all the interconnecting signals between cells are spiking signals of fixed height and/or pulse signals of fixed height and/or bi-directional pulse signals of a common absolute height. All the information on these signals is encoded in the timing of the spikes or pulses, as the case may be. The circuits of this invention do not require any analog feedback amplifiers. Simple 1 bit or 1.5 bit Digital to Analog Converters (DACs) are used to implement Voltage Controlled Current Sources (VCCSs) in all the internal feedback loops. Their gains are used to adjust the operation of the network.

BACKGROUND

The disclosed circuits are suitable for compact implementation in VLSI technology. Each elementary circuit is composed of DACs, integrators, hysteresis quantizers, delay elements and simple asynchronous logical gates. All the circuit feedback signals and the circuit output signal encode analog information in the time domain via asynchronous spike signals with just two or three amplitude levels. The information in these signals is not quantized.

U.S. Pat. No. 7,822,698 discloses apparatuses and methods for solving systems of coupled first order non-linear differential equations in either the spike domain or the pulse domain without quantization noise. The disclosed apparatuses and methods of that patent allow for fast feature extraction tasks to occur in either the spike domain or pulse domain, again without quantization noise. The technology of U.S. Pat. No. 7,822,698 can be applied to real-time non-linear processing of input analog signals, such as signals from RF or hyperspectral sensors.

Previously these tasks could be solved in the (1) original analog domain via analog amplifiers or in the (2) digital domain after an ADC (Analog to Digital Converter) digitization. In the analog domain the disadvantage is that accuracy is severely limited by dynamic range of the analog components (feedback analog amplifiers). In the digital domain the disadvantages include the fact that speed is limited by the performance of ADC conversion and that frequently digital circuits include timing gates that regardless of their frequency have the effect of introducing quantization noise since the (i) the amplitude of digital signals is inherently quantized and the timing of transitions is quantized by the presence of timing gates.

The disclosed circuitry of U.S. Pat. No. 7,822,698 avoids: (1) the accuracy limitations of analog computing and (2) the speed limitation and quantization noise of traditional ADC conversion. The implementation of the suggested circuit is more compact than an equivalent analog circuit or a traditional digital circuit. The key circuit components are hysteresis quantizers, integrators, and simple (and intrinsically-linear) 1-bit digital to analog converters.

The disclosed circuitry of U.S. Pat. No. 7,822,698 works in either the pulse domain or the spike domain. Generally speaking, this disclosure relates to merging the pulse domain circuits of U.S. Pat. No. 7,822,698 and the spike domain circuits of U.S. Pat. No. 7,822,698 into a single system. The spike domain is more biologically-inspired and can be more suitable when interfacing with biologically-inspired adaptive circuitry that is intended to operate with spikes. However, the pulse domain can be simpler to implement with standard electronic components, so certain advantages can arise by mixing the pulse domain technology of U.S. Pat. No. 7,822,698 with the spike domain technology of U.S. Pat. No. 7,822,698 as described herein.

U.S. Pat. No. 7,822,698 disclosed both pulse domain and spike domain embodiments of signal processors. This disclosure, besides mixing pulse domain and spike domain processors into a common system also discloses a bi-directional spike domain processor which can be used alone or in combination with either (or both) pulse domain and uni-directional spike domain embodiments of signal processors.

The prior art includes:

(1) A. Lazar and L Toth, "Perfect Recovery and Sensitivity Analysis of Time Encoded Bandlimited Signals," IEEE Trans. on Circuits and Systems–I, vol. 51, no. 10, pp. 2060-2073, October 2004. This document discloses a single time encoder circuit limit cycle oscillator. However, in this work the circuit has a single input and a single output. No computation is done beside the conversion from analog to pulse type.

(2) J. Cruz et al., "A 16×16 Cellular Neural Network Universal Chip," in Cellular Neural Networks and Analog VLSI, edited by L. Chua et al., Kluwer Academic Publishers, 1998. This document provides an example of an analog network to do classification tasks. The information is encoded in the amplitude of voltages or current signals. Accuracy is limited by the analog components, such as transconductance amplifiers.

(3) FIG. 1 of U.S. Pat. No. 7,822,698 is a diagram of a prior art time encoder. That circuit has a single analog input 2 and a single pulse output 4. That circuit encodes analog input signals into a pulse signals. If the analog signal is band limited the encoding can be without loss of information. That is, the input u(t) can be recovered from the timing of the output signal z(t). A time decoding machine of the type disclosed by Lazar and Toth (cited above) can be used to perfectly recover the analog input u(t) from the asynchronous pulse output z(t).

BRIEF SUMMARY OF THE INVENTION

The present invention provides, in one aspect, a neural network having an array of interconnected processors, at least a first processor in said array operating in a pulse domain and at least a second processor in said array operating in a spike domain. Each of those processors has: (a) first inputs selectively coupled to other processors in the array of interconnected processors, each first input having an associated voltage controlled current source coupled to a summing node; (b) second inputs selectively coupled to inputs of the neural network, the second inputs having current generators associated therewith coupled to said summing node; and a filter/integrator for generating an analog signal corresponding to current arriving at the summing node. For processors operating in the pulse domain, an analog-to-pulse converter for converting an analog signal derived either directly from the filter/integrator or via a non-linear element, to the pulse domain, and providing the converted analog signal as an unquantized pulse domain signal at an output of each processor operating in the pulse domain. For processors operating in the spike domain, an analog-to-spike converter for converting an analog signal derived either directly from the filter/integrator or via a non-linear element, to the spike domain, and providing the converted analog signal as an unquantized spike domain signal at an output of each processor operating in the spike domain. The array of interconnected processors are selectively interconnected with unquantized pulse domain and spike domain signals.

The present invention provides, in another aspect, a neural network having: an array of interconnected processors, each processor having both pulse domain and spike domain inputs and outputs, each processor having: first inputs selectively coupled to other processors in the array of interconnected processors, each first input having an associated voltage controlled current source coupled to a summing node, a filter/integrator for generating an analog signal corresponding to current arriving at the summing node, an analog-to-pulse converter, for converting an analog signal, derived either directly from the filter/integrator or via a non-linear element, to the pulse domain, and providing the analog signal as an unquantized pulse domain signal at an output of the processor, and an analog-to-spike convertor for converting the analog signal, derived either directly from the filter/integrator or via said non-linear element, to the spike domain, and providing the analog signal as an unquantized spike domain signal at another output of the processor. The array of interconnected processors are selectively interconnected with both said unquantized pulse domain signals and said said unquantized spike domain signals.

The present invention provides, in yet another aspect, a method of processing analog data comprising the steps of: (i) time encoding the analog data; (ii) setting weighting factors in an array of 1-bit DACs initially for processing the time encoded analog data; (iii) summing and filtering outputs of the array of 1-bit DACs; (iv) time encoding the filtered outputs of the outputs of the array of 1-bit DACs; and(v) coupling the time encoded filtered outputs and analog input data into inputs of the array of 1-bit DACs.

BRIEF DESCRIPTION OF THE DRAWINGS

FIG. 6 is a diagram showing a preferred embodiment of one bit DACs used with pulse domain and uni-directional spike domain signals.

FIG. 7 is a diagram showing a preferred embodiment of a voltage-to-current converter used with bi-directional spike domain signals. This voltage-to-current converter functions as a three-level DAC (it could be called a 1.5 bit DAC).

DETAILED DESCRIPTION OF A FIRST EMBODIMENT

Figure 1:
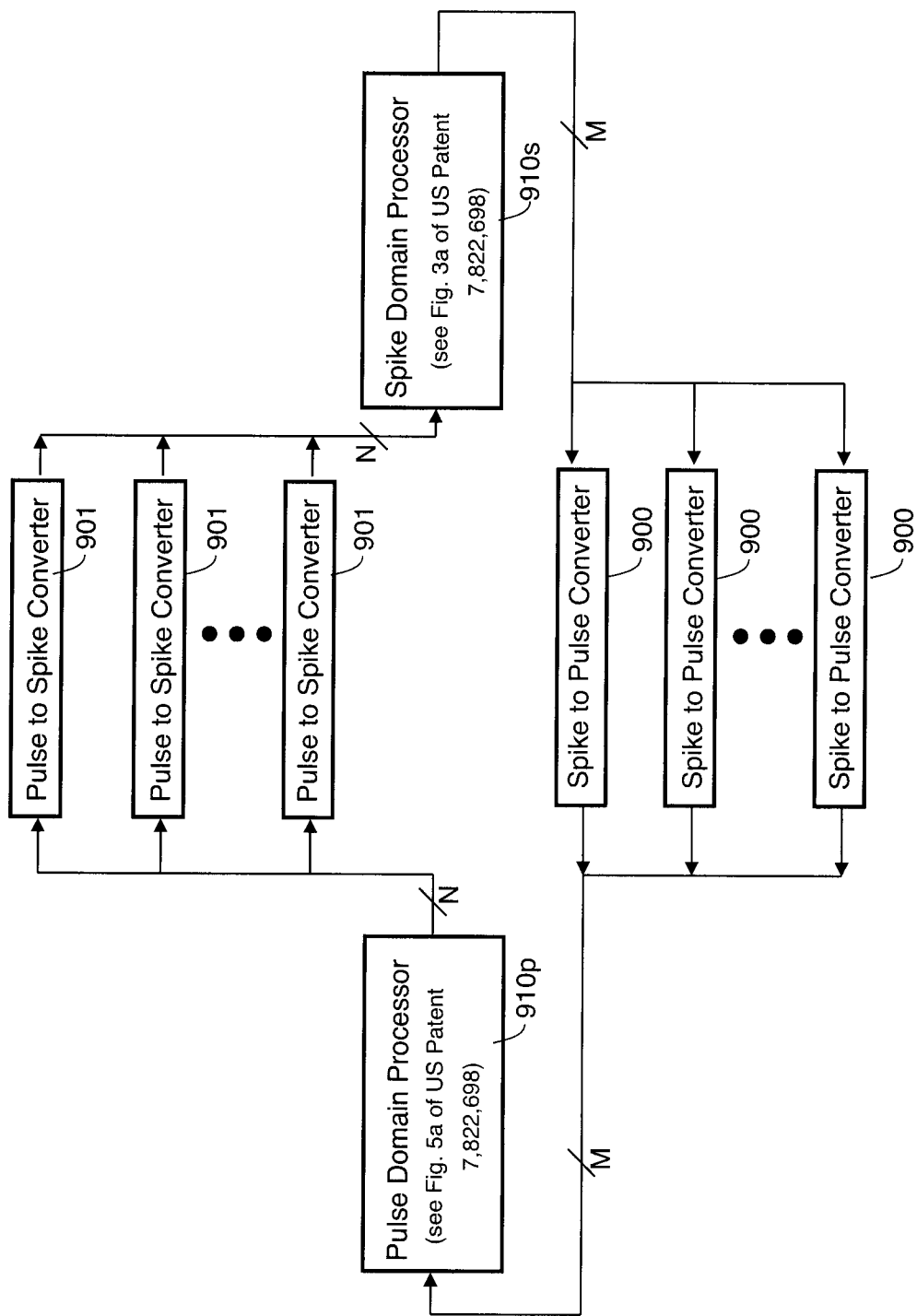
FIG. 1 shows a system composed a pulse domain processor and a spike domain processor. Each one of the processors is as described in U.S. Pat. No. 7,822,698, but the processors are interconnected as shown in this figure.

FIG. 1 is a simplified diagram of the overall architecture of a type of neural computer which combines spike domain and pulse domain signal processing. It is preferably comprised of many signal processing cells or processors 910, although only two processors 910 are depicted in FIG. 1, one which operates in the spike domain (and thus has a letter s as a subscript) and the other which operates in the pulse domain (and thus has a letter p as a subscript). In this particular embodiment, all of the outputs of spike domain processor 910s would occur in the spike domain and thus are converted to the pulse domain by a plurality of spike to pulse domain converters 900 before being applied to pulse domain processor 910p and all of the outputs of pulse domain processor 910p would occur in the pulse domain and thus are converted to the spike domain by a plurality of spike to pulse domain converters 901 before being applied to spike domain processor 910s. Each processor 910 is comprised of an array of processing cells or nodes.

The spike domain processor 910s is disclosed by U.S. Pat. No. 7,822,698 (particularly with reference to FIG. 3a thereof) while the pulse domain processor 910p is also disclosed by U.S. Pat. No. 7,822,698 (and particularly with reference to FIG. 5a thereof), and therefore do not require further description at this point.

A typical neural computer which combines spike domain and pulse domain signal processing would likely have more than one spike domain processor 910s and more than one pulse domain processor 910p. Pulse domain outputs from pulse domain processors to other pulse domain processors can be connected directly (without domain conversion) as described in U.S. Pat. No. 7,822,698 and spike domain outputs from spike domain processors to other spike domain processors can be connected directly (without domain conversion) as also described in U.S. Pat. No. 7,822,698. But pulse domain outputs from pulse domain processors to spike domain processors need domain conversion as described herein and spike domain outputs from spike domain processors to pulse domain processors need domain conversion as described herein.

Considering again the simplified embodiment of FIG. 1, the pulse domain processor 910p has a total of $N_T$ processing nodes, while the spike domain processor 910s has a total of $M_T$ processing nodes. The entire system of FIG. 1 has a total $N_T+M_T$ processing nodes. The pulse domain processor 910p has a number of nodes N ($N \leq N_T$) that provide outputs to the spike domain processor 910s. And the spike domain processor 910s has a number of nodes M ($M \leq M_T$) that provide outputs to the pulse domain processor 910p. This system includes an array of M Spike-to-Pulse domain converters 900 and an array of N Pulse-to-Spike domain converters 901 to interconnect the two processors 910s and 910p.

FIG. 2b of U.S. Pat. No. 7,822,698 shows a typical spike domain signal. All the information is encoded by the timing of the spikes ($t_1, t_2, t_3, \ldots$). These timing values are preferably not quantized time-wise. The amplitude of inter-cell spike domain signals is quantized and is regenerated at a receiving cell or processor. The encoded spike domain signal is not subject to distortion due to signal amplitude attenuation during transmission from one cell 910s to another cell 910s or to a pulse domain cell 910p (via a converter 900). The spike encoding can be used without quantization or information loss. In addition to spike domain encoding, pulse domain encoding is also used instead. FIG. 2c of U.S. Pat. No. 7,822,698 shows a typical pulse encoded signal. As in the case of the spike domain signal of FIG. 2b of U.S. Pat. No. 7,822,698, timing values of the pulse encoded signals are also preferably not quantized time-wise. The amplitude of inter-cell pulse signals is quantized and is regenerated at a receiving cell. The encoded pulse signal is not subject to distortion due to signal amplitude attenuation during transmission from one cell 910p to another cell 910p or to a spike domain cell 910s (via a converter 901). This encoding is done without quantization or information loss.

Figure 2:
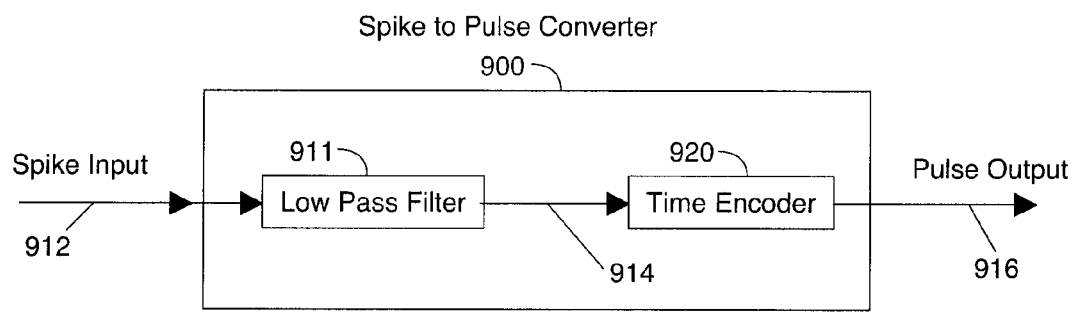
FIG. 2 shows a detail of a Spike to Pulse Converter, which is composed of a low pass filter and of a time encoder (see also FIG. 5b of U.S. Pat. No. 7,822,698)—the low pass filter can be of a first order (for example a resistor in parallel with one capacitor) or of a higher order.

FIG. 2 shows a detail of a spike to pulse converter 900 which has a low pass filter 911 and a time encoder 920 (preferably embodied as the time encoder shown and described with reference to FIG. 5c of U.S. Pat. No. 7,822,698). The low pass filter 911 can be of a first order (as for example a resistor in parallel with one capacitor) or of a higher order.

The cut off frequency of filter 911 should be lower than the spike rate at the output of the processor 910s. This ensures that the signal at internal node 914 is an analog signal without significant spike components.

The cut off frequency of filter 911 should be higher than cut off frequency of the internal filter of the receiving pulse processor 910p (element 105 of FIG. 5a of U.S. Pat. No. 7,822,698). This ensures that the analog information embedded in the spike train 912 is not lost.

Figure 3:
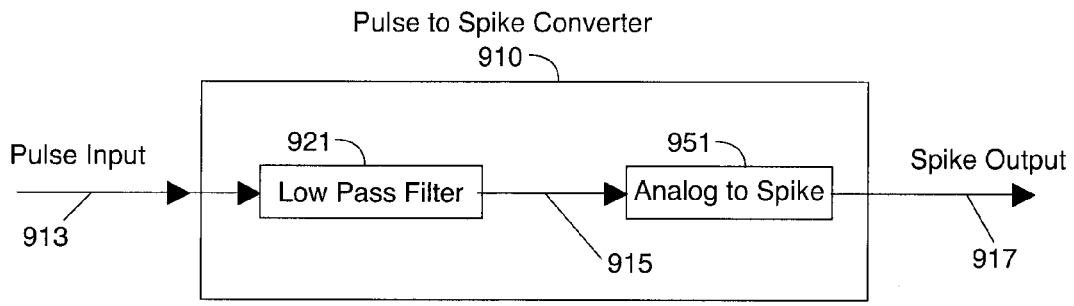
FIG. 3 shows a detail of a Pulse to Spike Converter, which is composed of a low pass filter and of a Analog-to-Spike converter (see also FIG. 3b of U.S. Pat. No. 7,822,698)—the low pass filter it can be of a be first order (for example a resistor in parallel with one capacitor) or of a higher order.

FIG. 3 shows a detail of a pulse to spike converter 901 which has a low pass filter 921 and an analog-to-spike converter (preferably embodied as the analog-to-spike converter shown and described with reference to FIG. 3b of U.S. Pat. No. 7,822,698). The low pass filter 921 can be first order (as for example a resistor in parallel with one capacitor) or higher order.

The cut off frequency of filter 921 should be lower than the pulse rate at the output of the processor 910p. This ensures that the signal at internal node 915 is an analog signal without significant pulse components.

The cut off frequency of filter 921 should be higher than cut off frequency of the internal filter of the receiving spike processor 910s (element 105 of FIG. 3a of U.S. Pat. No. 7,822,698). This ensures that the analog information embedded in the pulse train 913 is not lost.

The circuits of FIGS. 1, 2 and 3 (first embodiment) allow merging Pulse Domain and Spike domain sub-systems in a single system. Spike domain is more biologically-inspired and can be more suitable when interfacing with biologically-inspired adaptive circuitry that is intended to operate with spikes. However, Pulse domain can be simpler to implement with standard electronics components.

The circuits of FIGS. 1, 2 and 3 are specially suited for the case in which $M+N<<M_T+N_T$. That is when the number of converters needed is much less than the number of processing nodes. In that case, the converters 900, 901 do not add significant complexity to the system. In the worst case, when $M=M_T$ and $N=N_T$, the number of converters 900, 901 equals the number of nodes, but even in this case the complexity added by the converters 900, 901 is less than a factor of two (as each converter 900, 901 is simpler than a processing cell or node of a processor).

DETAILED DESCRIPTION OF A SECOND EMBODIMENT

Figure 4:
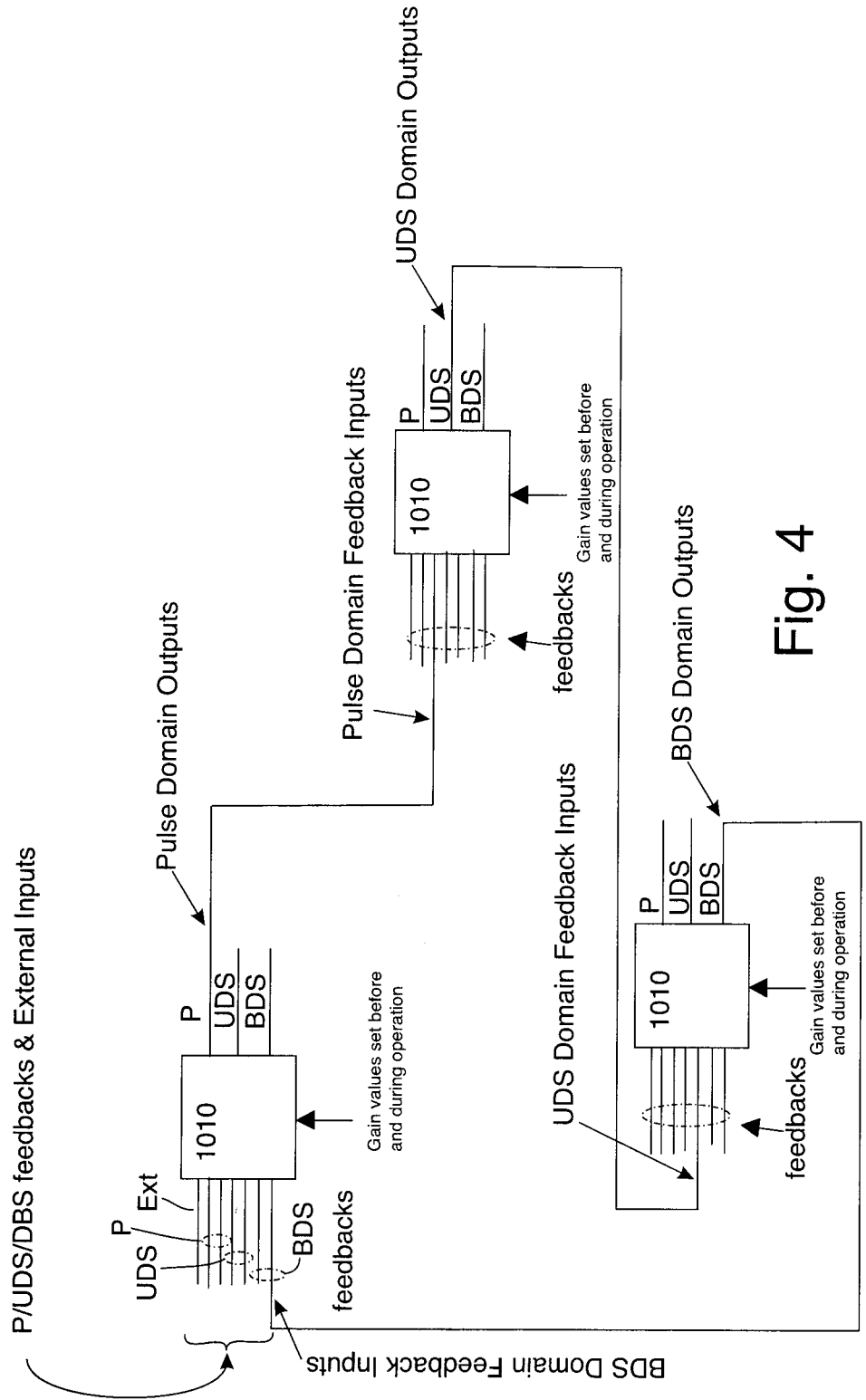
FIG. 4 shows a second embodiment of a processor which merges pulse domain and spike domain signals—in this embodiment the processing cells are able to produce different types of outputs (pulse or spike) and to accept different types of inputs (pulse or spike) and the spike domain inputs and outputs can either be uni-directional spike domain signals or bi-directional spike domain signals.

FIG. 4 shows a second embodiment of a neural computer which combines spike domain and pulse domain signal processing. In this embodiment the processing cells are modified to be able to produce different types of outputs (pulse or spike) and to accept different types of inputs (pulse or spike). Additionally, two different types of spike domain signals can be utilized. The spike domain signals described above with reference to FIG. 2b of U.S. Pat. No. 7,822,698 is one of the two types and will be referred to as uni-directional spike domain signals in this detailed description of the second embodiment. The other type of spike domain signals are bi-directional spike domain signals which as depicted in FIG. 4a. These bi-directional spike domain signals are similar to the uni-directional spike domain signals FIG. 2b of U.S. Pat. No. 7,822,698, except that the individual pulses alternate polarity. They preferably have the same absolute values (the same height whether plus or minus). All the information is encoded by the timing of the individual spikes ($t_1, t_2, t_3, \ldots$). These timing values are preferably not quantized time-wise. The absolute amplitude of inter-cell spike signals is quantized and is regenerated at a receiving cell or processor.

In this embodiment separate domain convertors between cells are not needed. Even though individual processing cells are more complex in this embodiment, the total number of filters (which are used both in the converters and in the processors of the first embodiment) is smaller than in the first embodiment. This second embodiment is suitable when a mixed spike and pulse domain processor is implemented in a technology in which it is desirable to minimize the number of filters (or the number of capacitors typically needed to implement the filters).

FIG. 4 depicts an embodiment with three exemplary processing nodes (processors 1010) of a neural computer. Each node 1010 can preferably produce multiple types of outputs (pulse (P) domain, uni-directional spike (UDS) domain, or bi-directional spike (BDS) domain). Each node 1010 can receive multiple types of inputs (pulse (P) domain, uni-directional spike (UDS) domain, or bi-directional spike (BDS) domain). The inputs can either be feedbacks from other processors 1010 or the inputs can be external (Ext) signal inputs to the nodes of the computer.

Figure 5:
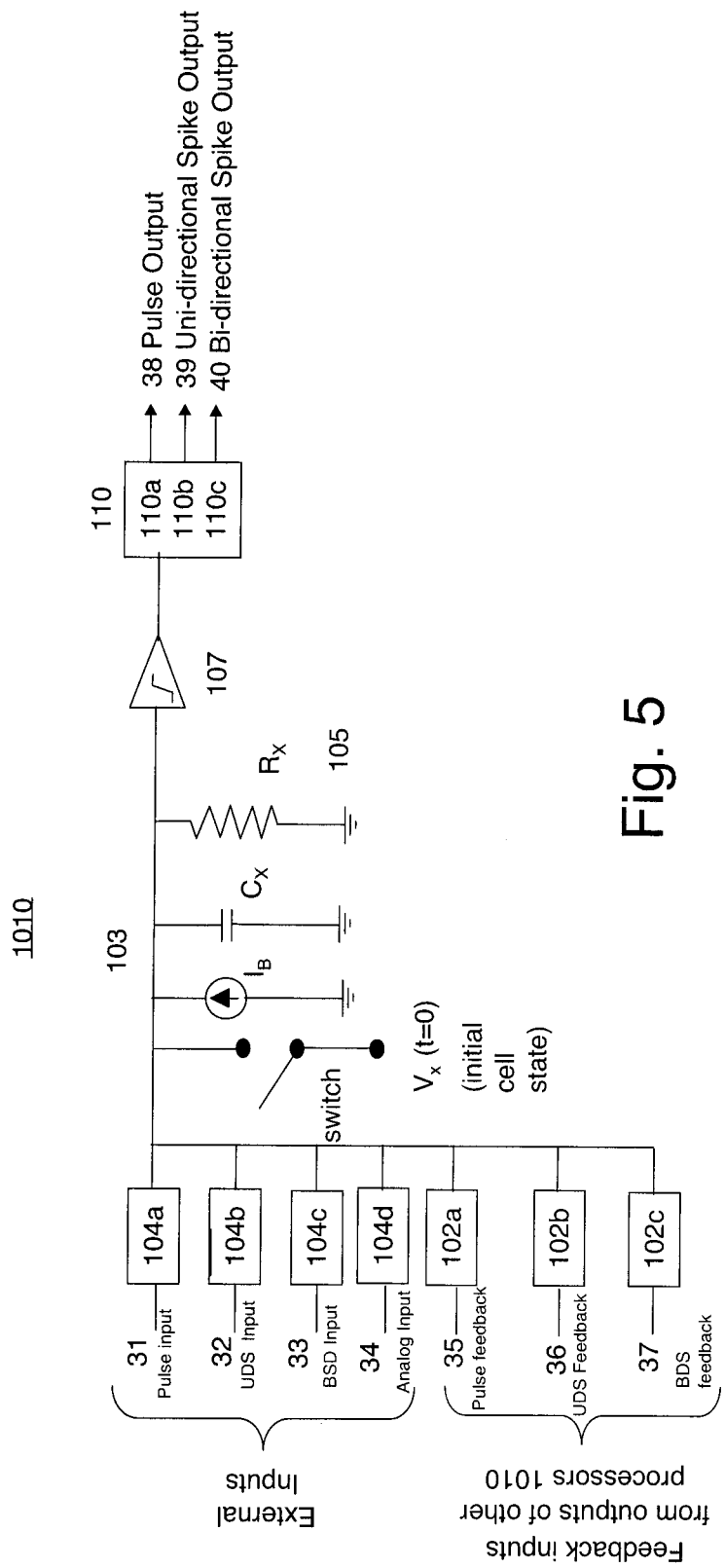
FIG. 5 provides a more detailed diagram of an individual processing node of FIG. 4.

FIG. 5 shows a schematic diagram of a processing node 1010 of FIG. 4, which is similar to the processing nodes of FIGS. 3a and 5a of U.S. Pat. No. 7,822,698, but element 110 of U.S. Pat. No. 7,822,698 is replaced by a parallel arrangement of circuits 110a, 110b and 110c that can respectively produce pulse output signals on line 38, uni-directional spike output signals on line 39, and/or bi-directional spike output signals on line 40. Circuits 110a, 110b and 110c are described below with reference to FIGS. 9-13.

The arrays of input and feedback voltage controlled current sources (one-bit DACs) 104 and 102 of U.S. Pat. No. 7,822,698 are replaced by a set of multiple arrays of Voltage Controlled Current Sources (VCCSs) which are preferably implemented by arrays of 1-bit DACs (except when bi-directional pulse type singes are sensed, in which case 1 three level DAC is used instead) 104a-104d and 102a-102c. Each DAC or VCCS is designed to be controlled by a particular type of input signal (pulse, uni-directional, or bi-directional spike). So array of VCCSs 104a (preferably implemented by one-bit DACs) is responsive to a a set of pulse signals 31 provided by external sources, while array of VCCSs 104b (preferably implemented by one-bit DAC's) is responsive is to a set of uni-directional spike signals 32 provided by external sources, and array of VCCSs 104c (preferably implemented by three-level DACs) is responsive to a set of bi-directional spike signals 33 provided by external sources. Array of VCCSs 104d is responsive to a set of analog signals 34 provided by external sources. Not all processors 1010 in an array of processors 1010 are necessarily connected to external source(s) and, even when connected to external source(s), the external source(s) may only provide signals in one domain. The node 1010 of FIG. 5 is preferably implemented as a general purpose neural node with inputs provided for external sources in each of the four aforementioned input signal domains (pulse, uni-directional spike, bi-directional spike and analog). Array of VCCSs 102a (preferably implemented by one-bit DACs) is responsive to a set of pulse feedback signal 35 generated by other processors 1010, array of VCCCs 102b (preferably implemented by one-bit DACs) is responsive to a set of uni-directional spike feedback signals 36 generated by other processors 1010, and array of VCCSs 104c (preferably implemented by three-level DACs) is responsive to a bi-directional spike feedback signal 37 generated by another processor. As such, the node 1010 of FIG. 5 is preferably implemented as a general purpose neural node with inputs provided for feedback sources in each of the three aforementioned feedback signal domains (pulse, uni-directional spike, and bi-directional spike).

Array of VCCSs 104a, 104b, 102a and 102b (preferably implemented by one-bit DACs) are shown in greater detail by FIG. 6, discussed below while array of VCCS's 104c and 102c (three-level DACs) are shown in greater detail by FIG. 7, also discussed below. Array of VCCSs 104d is shown in greater detail by FIG. 8, discussed below.

The outputs of the arrays 102a-102c and 104a-104d of VCCSs (preferably implemented by one-bit DACs) are coupled together in a current-summing fashion at a node 103 and converted to an analog voltage $V_x(t)$ by means of an internal analog filter 105. This filter 105 is preferably a low pass filter. It can be a first order (or higher order) low pass filter. If it is a first order low pass filter it can be simply implemented as a capacitor in parallel with a resistor. A saturation-type nonlinearity 107 is preferably used after filter 105. This type of nonlinearity allows many additional image processing tasks to be performed than if it were eliminated, and given the fact that it is easily implemented, it is preferably included. While in some embodiments it can be eliminated, it is preferably embodied using a saturation-type differential amplifier.

Some of the processors 1010 of FIG. 4 may have unused inputs or outputs. In that case the circuit of each node can be simplified as opposed to utilizing the general purpose processor 1010 depicted. That is, the individual processors in the array of FIG. 4 may not require all the circuitry shown in FIG. 5, but only require the input, feedback and output circuitry associated with those types of signals which are utilized in solving a particular problem. But a general purpose array of neutral processors 1010 would preferably each include all of the circuitry of FIG. 5 in other to be programmable in terms of solving a wide range of problems.

In FIG. 6, each diamond-shaped current source generates a current depending on the nature of the input. For VCCS/DAC 102a the input is a pulse train, the current is hi or low depending on the input, i.e. $I=gf_nF(vi)$. $gf_n$ is the gain of the VCCS or DAC, $v_i$ is the input signal and F is a function. For VCCS/DAC 102b the input is a train of spikes, the output is a current proportional to the input voltage (hi or low), hence the current is hi or low. The function F has a saturation-type input-output transfer characteristic. This allows the output current levels (high and low) of each DAC to be well defined, even in the presence of small variations of the high or low voltage levels of the input pulse signal.

In FIG. 7 a three level DAC used for arrays of DAC's 102c and 104c is shown. For DACs 102c or 104c, the input is bidirectional spikes, the output is a current Hi, Low or Zero. The exemplary multi-level DAC embodiment of FIG. 7 operates with 3-levels (high, low and zero), while each one-bit DACs of FIG. 6 operates with only 2 levels (high and low). The DAC of FIG. 7 has a voltage input and a current output and is implemented with three comparators and two voltage to current converters. There are thee possible inputs voltages: High (1V in an embodiment), zero (0V), and Low (−1V in an embodiment). Below is given how the circuit operates for these three cases:

When the input to the DAC of FIG. 7 is +1V: (a) The output of the upper comparator 143 is 1V so the output of upper voltage to current converter 139 is a current of value +I. (b) The output of lower comparator 143 is 0V so the output of lower voltage to current converter 139 is a current of value 0. The final current is the sum of the currents provided by the two elements 139. In this case the total output current is +I.

When input to the DAC of FIG. 7 is 0V: (a) The output of the upper comparator 143 is 0V and therefor the output of upper voltage to current converter 139 is a current of value 0. (b) The output of the lower comparator 143 is 0V and therefor the output of lower voltage to current converter 139 is a current of value 0. The final current is the sum of the currents provided by the two elements 139. In this case the total output current is 0.

When input to the DAC of FIG. 7 is −1V: (a) The output of upper comparator 143 is 0V and thus the output of upper element 139 is a current of value 0. (b) The output of lower comparator 143 is 1V so the output of lower element 139 is a current of value −I. The final current is the sum of the currents generated by the two elements 139. In this case the total output current is −I.

The three level DAC of FIG. 7 provides three possible current outputs: +I (high), 0 (zero), −I (low). This circuit provides well defined output currents even in the presence of small variations of the High, Zero and Low voltage levels of the input pulse signal.

Figure 8:
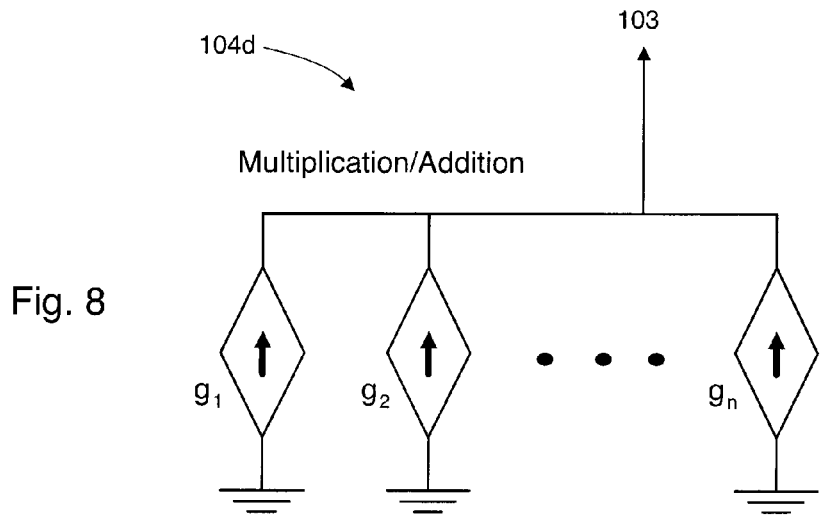
FIG. 8 is a diagram showing a preferred embodiment of an array of voltage-to-current converters used with external analog signals.

In FIG. 8 DAC 104d is shown. For DAC 104d, the input is a continuous analog signal outside the processor (i.e. an external analog signal). The output of DAC 104d is a current $I=g_n \cdot vi$ where $g_n$ is the gain of DAC 104d, $v_i$ is the input analog signal. All gain values are set or programmed in either before operation or during operation.

Figure 9:
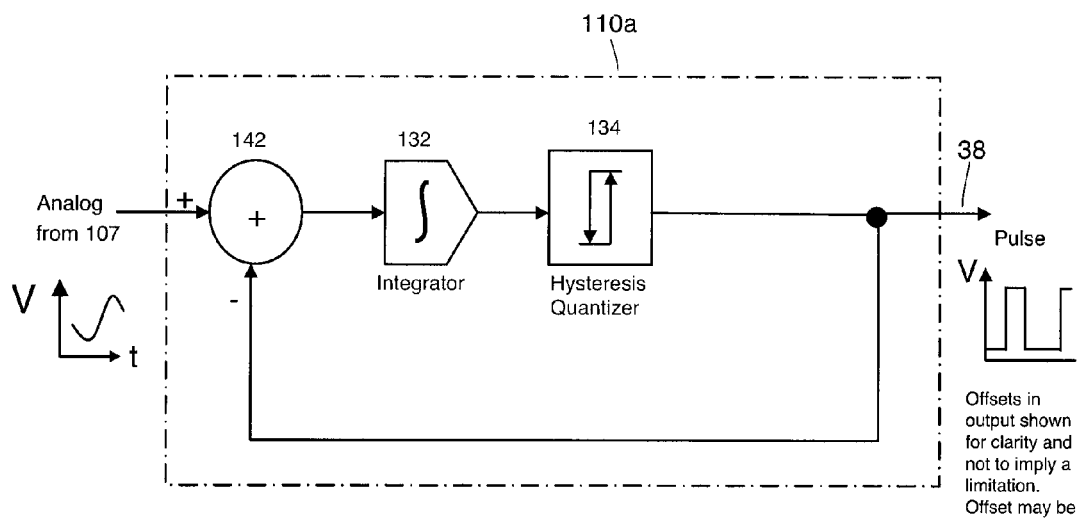
FIG. 9 depicts a pulse time encoder.

FIG. 9 depicts circuit 110a in greater detail. Circuit 110a is a pulse time encoder and is preferably comprised of an integrator 132, and an asynchronous hysteresis quantizer 134. The output of the asynchronous hysteresis quantizer 134 is fed back to the encoder's input via a summing node 142 and also provides the output 38 of the pulse time encoder.

Figure 10:
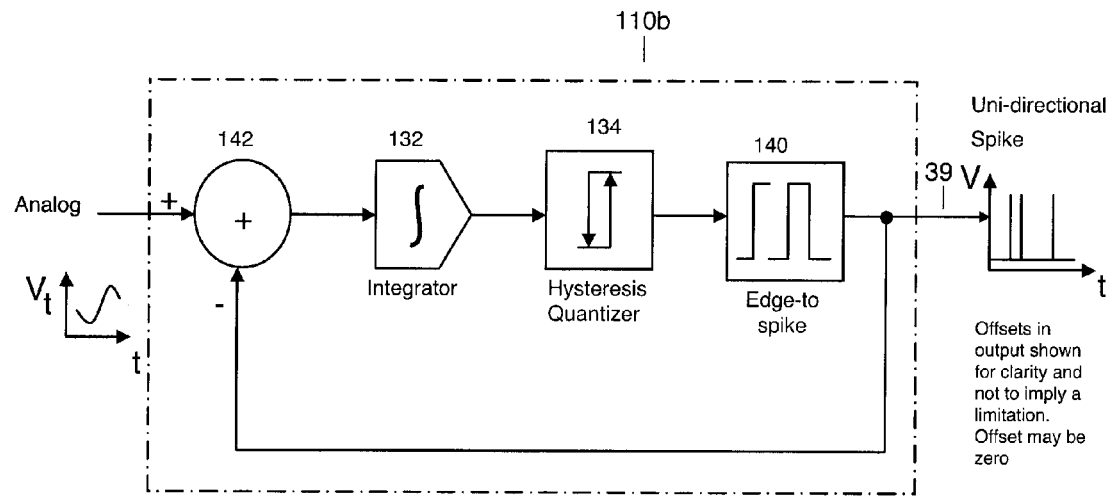
FIG. 10 depicts a uni-directional spike time encoder.

FIG. 10 depicts circuit 110*b* in greater detail. Circuit 110*b* is a uni-directional spike time encoder and is preferably comprised of an integrator 132, an asynchronous hysteresis quantizer 134, and edge-to-spike converter 140, which converter 140 preferably comprises a delay element 136 (see FIG. 12), and a two-input asynchronous logic gate 138 (see also FIG. 12). This gate is an asynchronous AND gate, one of whose inputs is inverted. An output of the edge-to-spike converter 140 is fed back to the encoder's input via a summing node 142 and also provides the output 39 of the uni-directional spike time encoder.

Figure 11:
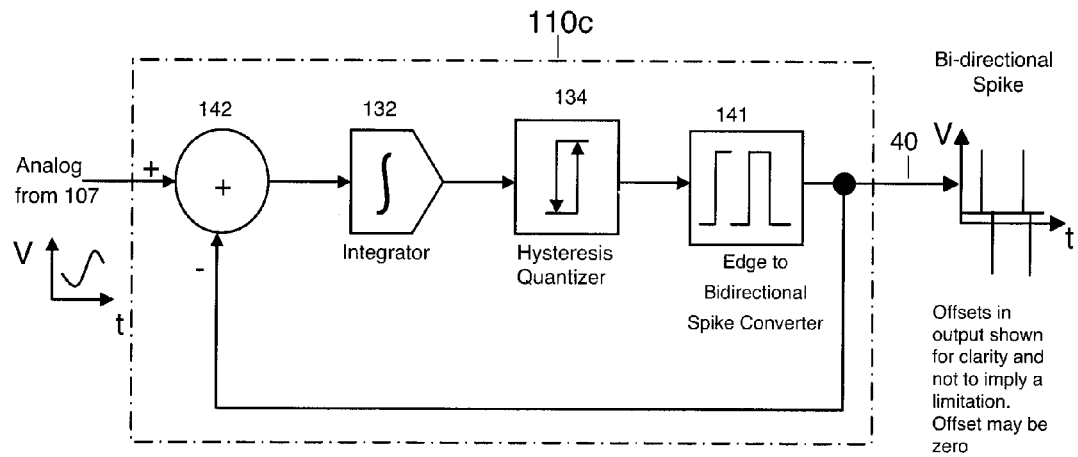
FIG. 11 depicts a bi-directional spike time encoder.

FIG. 11 shows circuit 110*c* in greater detail. Circuit 110*c* is a bi-directional spike time encoder and preferably comprises an integrator 132, an asynchronous hysteresis quantizer 134, and edge-to-bidirectional spike converter 140. An output of the edge-to-bidirectional spike converter 140 is fed back to the encoder's input via a summing node 142 and also provides the output 40 of the bi-directional spike time encoder.

Figure 12:
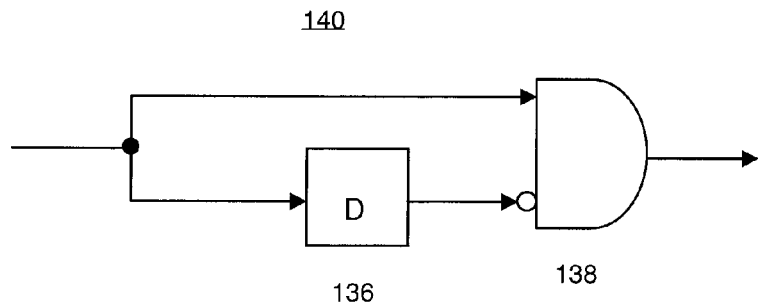
FIG. 12 is a schematic diagram of an edge to spike circuit utilized in FIG. 10.

FIG. 12 is a schematic diagram of edge to spike circuit 140 utilized in FIG. 10. D is a delay element that sets the duration of a spike. The amount of delay has to be less than the smallest spacing between adjacent spikes in a train of spikes. The amount of delay may be fixed since data is encoded in the spike domain by the duration between the leading edges of the spikes (or the trailing edges).

Figure 13:
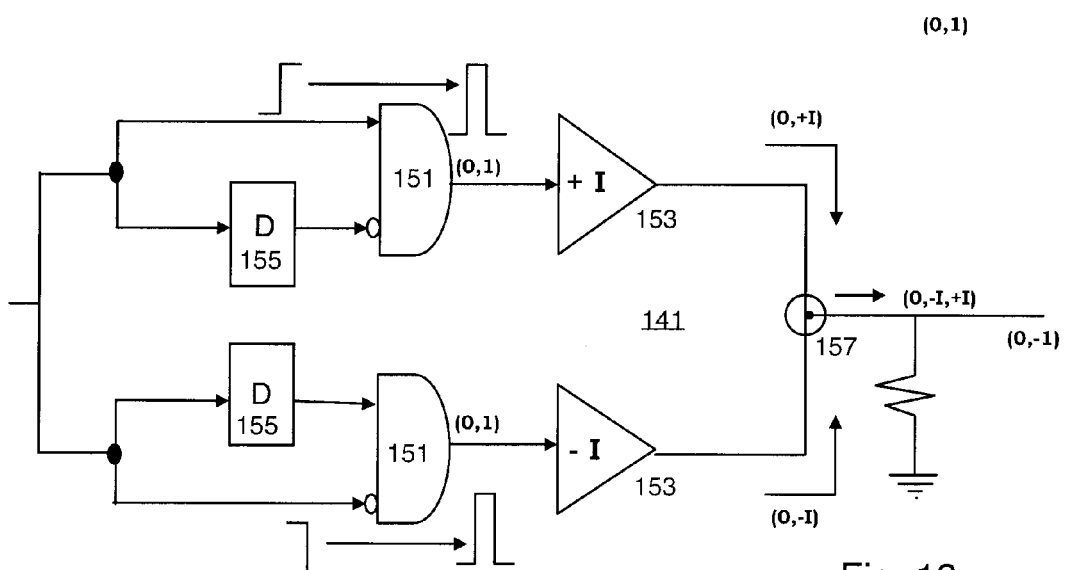
FIG. 13 depicts an embodiment of the bi-directional spike converter utilized in the bi-directional spike time encoder of FIG. 11.

FIG. 13 shows a preferred embodiment of the bi-directional spike converter 141 utilized in the edge-to-bidirectional spike time encoder of FIG. 11. The edge-to-bidirectional spike takes a pulse type voltage input (exhibiting two voltage levels) and produces a bidirectional spike type voltage output (exhibiting three voltage levels). The three cases of operation of the circuit are as follows: (1) The circuit produces a positive spike (of short duration D) whenever there is a positive edge in the pulse input, or (2) the circuit produces a negative spike (of short duration D) whenever there is a negative edge in the pulse input, or (3) the circuit produces no spike when the input has no transitions.

The operation of the circuit of FIG. 13 for three cases is described in greater detail below:

(1) When there is a positive edge at the input: (a) the output of the upper AND gate 151 produces a voltage pulse of 1V amplitude and short duration D (as controlled by the upper delay element 155) and the output of the upper voltage to current converter 153 produces a current pulse of amplitude +I and short duration D. (b) The output of the lower AND gate 151 remains at 0V and the output of the lower voltage to current converter 153 produces no current. (3) The combined current of the two branches at summing node 157 is a current pulse of amplitude +I and short duration D. This is converted to a voltage by the output resistor, R. This produces a positive voltage spike.

(2) When there is a negative edge at the input: (a) The output of the upper AND gate 151 remains at 0V and the output of the upper voltage to current converter 153 produces no current. (b) The output of the lower AND gate 151 produces a voltage pulse of 1V amplitude and short duration D (as controlled by the lower delay element 155). The output of the lower voltage to current converter 153 produces a current pulse of amplitude −I and short duration D. (c) The combined current of the two branches at summing node 157 is a current pulse of amplitude −I and short duration D. This is converted to a voltage by the output resistor, R. This produces a negative voltage spike.

(3) When there is no transition at the input: (a) The output of the upper AND gate 151 remains at 0V and the output of the upper voltage to current converter 153 produces no current. (b) The output of the lower AND gate 151 remains at 0V and the output of the lower voltage to current converter 153 also produces no current. (c) The combined current of the two branches is 0 and the output voltage is 0. There is no output spike. The output remains at Zero.

The foregoing description, for purposes of explanation, has been described with reference to specific embodiments of the invention and having described the invention in connected with those embodiments, modification will now doubtlessly suggest itself to those skilled in the art. As such, the illustrative discussions above are not intended to be exhaustive or to limit the invention to the precise forms disclosed and therefor the invention is not to be limited by those illustrative discussions except as required by the appended claims.

What is claimed is:

1. A neural network comprising:
an array of interconnected processors, at least a first processor in said array operating in a pulse domain and at least a second processor in said array operating in a spike domain, and each said processor having:
first inputs selectively coupled to other processors in said array of interconnected processors, each first input having an associated voltage controlled current source coupled to a summing node,
second inputs selectively coupled to inputs of the neural network, the second inputs having current generators associated therewith coupled to said summing node,
a filter/integrator for generating an analog signal corresponding to current arriving at the summing node, and for processors operating in the pulse domain, an analog-to-pulse converter for converting an analog signal derived either directly from the filter/integrator or via a non-linear element, to the pulse domain, and providing the converted analog signal as an unquantized pulse domain signal at an output of each processor operating in the pulse domain and for processors operating in the spike domain, an analog-to-spike converter for converting an analog signal derived either directly from the filter/integrator or via a non-linear element, to the spike domain, and providing the converted analog signal as an unquantized spike domain signal at an output of each processor operating in the spike domain; wherein the array of interconnected processors are selectively interconnected with unquantized pulse domain and spike domain signals.

2. The neural network of claim 1 wherein each current generator associated with the second inputs comprise a 1-bit DAC with adjustable gain.

3. The neural network of claim 2 wherein the voltage controlled current source is a 1 bit DACs with adjustable gain.

4. The neural network of claim 3 wherein the interconnection of the array of interconnected processors is effected selectively and the gains of the 1 bit DACs are adjusted selectively to control a nature of a problem solved by the neural network.

5. The neural network of claim 4 further including a bias generator operatively connected to the summing node.

6. The neural network of claim 5 wherein the bias generator comprises a current source.

7. The neural network of claim 5 wherein the bias generator comprises a voltage source and either an analog to pulse converter when the array of interconnected processors operate in the pulse domain or an analog to spike converter when the array of interconnected processors operate in the spike domain.

8. The neural network of claim 1 wherein the analog-to-pulse converter comprises a time encoder having a summing node, an integrator having an input coupled to an output of the summing node and a hysteresis quantizer coupled to an output of the integrator, the hysteresis quantizer having an output proving an output of the time encoder and providing an input to the summing node, the summing node also providing an input to the time encoder.

9. The neural network of claim 1 wherein the analog-to-spike converter comprises a spike time encoder having a summing node, an integrator having an input coupled to an output of the summing node, a hysteresis quantizer coupled to an output of the integrator, an edge to spike convertor coupled to an output of the hysteresis quantizer, the edge to spike convertor having an output proving an output of the time encoder and providing an input to the summing node, the summing node also providing an input to the spike time encoder.

10. The neural network of claim 1 wherein at least one output of said first processor in said array is coupled to at least one input of said second processor in said array via a pulse domain to spike domain converter.

11. The neural network of claim 1 wherein at least one output of said second processor in said array is coupled to at least one input of said first processor in said array via a spike domain to pulse domain converter.

12. A neural network comprising:
an array of interconnected processors, each processor having both pulse domain and spike domain inputs and outputs, each said processor having:
first inputs selectively coupled to other processors in said array of interconnected processors, each first input having an associated voltage controlled current source coupled to a summing node,
a filter/integrator for generating an analog signal corresponding to current arriving at the summing node,
an analog-to-pulse converter, for converting an analog signal, derived either directly from the filter/integrator or via a non-linear element, to the pulse domain, and providing the analog signal as an unquantized pulse domain signal at an output of the processor, and
an analog-to-spike convertor for converting the analog signal, derived either directly from the filter/integrator or via said non-linear element, to the spike domain, and providing the analog signal as an unquantized spike domain signal at another output of the processor;
wherein the array of interconnected processors are selectively interconnected with both said unquantized pulse domain signals and said said unquantized spike domain signals.

13. The neural network of claim 12 wherein at least a selected one of said processors include second inputs selectively coupled to inputs of the neural network, the second inputs having current generators associated therewith coupled to said summing node of at least said selected one of said processors.

14. The neural network of claim 12 wherein each current generator associated with the second inputs comprise a 1-bit DAC.

15. The neural network of claim 14 wherein the voltage controlled current sources are 1 bit DACs with adjustable gains.

16. The neural network of claim 15 wherein the interconnection of the array of interconnected processors is effected selectively and the gains of the 1 bit DACs are adjusted selectively to control a nature of a problem solved by the neural network.

17. The neural network of claim 16 further including a bias generator operatively connected to the summing node of at selected ones of said processors.

18. The neural network of claim 12 wherein the analog-to-pulse converter comprises a time encoder having a summing node, an integrator having an input coupled to an output of the summing node and a hysteresis quantizer coupled to an output of the integrator, the hysteresis quantizer having an output proving an output of the time encoder and providing an input to the summing node, the summing node also providing an input to the time encoder.

19. The neural network of claim 12 wherein the analog-to-spike converter comprises a spike time encoder having a summing node, an integrator having an input coupled to an output of the summing node, a hysteresis quantizer coupled to an output of the integrator, an edge to spike convertor coupled to an output of the hysteresis quantizer, the edge to spike convertor having an output proving an output of the time encoder and providing an input to the summing node, the summing node also providing an input to the spike time encoder.

20. The neural network of claim 12 wherein the spike domain is a uni-directional spike domain and wherein each processor additionally has bi-directional spike domain inputs and outputs.

* * * * *